United States Patent [19]
Spillman, Jr.

[11] Patent Number: 4,564,289
[45] Date of Patent: Jan. 14, 1986

[54] SINGLE MODE OPTICAL FIBER POLARIMETRIC STRESS SENSOR HAVING OPTICAL COMMON MODE REJECTION

[75] Inventor: William B. Spillman, Jr., Acton, Mass.

[73] Assignee: Geo-Centers, Inc., Newton Upper Falls, Mass.

[21] Appl. No.: 636,397

[22] Filed: Jul. 31, 1984

[51] Int. Cl.$^4$ .................... G01B 11/18; G01D 5/26
[52] U.S. Cl. ...................... 356/33; 73/705; 250/225; 250/227; 250/231 P
[58] Field of Search .................. 356/33–35, 356/364–368, 44; 250/225, 227, 231 R, 231 P; 350/371, 403; 73/705, 800, 862.3

[56] References Cited

U.S. PATENT DOCUMENTS

| | | | |
|---|---|---|---|
| 3,096,388 | 7/1963 | Davenport | 356/33 |
| 3,602,597 | 8/1971 | Sproul | 250/225 X |
| 3,950,987 | 4/1976 | Slezinger et al. | 356/33 X |
| 4,269,483 | 5/1981 | Feldtkeller | 356/368 X |
| 4,368,645 | 1/1983 | Glenn et al. | 356/33 X |
| 4,442,350 | 4/1984 | Rashleigh | 250/227 |

Primary Examiner—Vincent P. McGraw
Attorney, Agent, or Firm—Louis Orenbuch

[57] ABSTRACT

An instrument for measuring stress is arranged to be insensitive to stresses caused by conditions other than that of the phenomenon to be measured. The instrument employs two equal lengths of optical fibers of the kind exhibiting birefringence when stressed. Polarized light is directed into one of the optical fibers along its longitudinal axis. The two optical fibers are arranged in series with respect to the longitudinal transmission of the polarized light through those fibers. A polarization rotator is situated in the light path between the two optical fibers. The polarized light transmitted through the polarization rotator is rotated by an amount causing stresses imposed equally on the two optical fibers to have equal and opposite effects of the transmitted polarized light. The invention may be embodied to permit the measurement of acceleration, pressure, fluid flow rate, magnetic field gradient, magnetic field strength, electric field strength, electric field gradient, or any other phenomena that can be made to produce stress on an optical fiber. The invention is especially useful in differential measurement because the device measures the difference in stress imposed on the two optical fibers.

5 Claims, 5 Drawing Figures

SINGLE MODE OPTICAL FIBER POLARIMETRIC STRESS SENSOR HAVING OPTICAL COMMON MODE REJECTION

TECHNICAL FIELD OF INVENTION

This invention relates in general to the measurement of stress by apparatus utilizing the photoelastic effect. More particularly the invention pertains to a measuring device of the kind utilizing the photoelastic effect which device is arranged to be insensitive to stresses caused by common mode or ambient conditions that would otherwise impair the accuracy or sensitivity of the device.

PRIOR ART BACKGROUND OF THE INVENTION

Photoelasticity is the phenomenon of stress (or strain) induced birefringence in optically transparent materials. Many of those materials, in their unstressed state, are isotropic. When a uniaxial stress is applied to those materials, a difference in the index of refraction is introduced between the stress direction and directions orthogonal to it. Sensors based on this phenomenon have been reported previously by I. I. Slezinger et al. in U.S. Pat. Nos. 3,950,987 and 4,010,632. In addition, sensors based upon that phenomenon but incorporating fiber optic technology have been reported by W. H. Glenn and R. G. Tomlinson in U.S. Pat. Nos. 4,321,831 and 4,368,645. None of those patents, however, addresses the problem of making the sensor insensitive to changes in ambient conditions that produce unwanted changes in the sensor output.

It is known that stressing of a non-birefringent single mode optical fiber destroys mode degeneracy in the fiber and thereby produces birefringence. A strain measuring device using that property of the single mode optical fiber in its photoelastic sensing element is described in U.S. Pat. No. 4,173,412 granted to M. Ramsay and S. H. Wright. In that patent, an arrangement is described in which a single mode optical fiber is strained while polarized light having one component in and another component perpendicular to the strain direction propagates through the fiber. The two polarized components of the light emerging from the fiber are then used to obtain a measurement of the strain on the fiber. The Ramsay and Wright patent, like those cited previously, does not address the problem of making the photoelastic sensing element of the device insensitive to changes in temperature, air pressure, and other ambient conditions that produce unwanted changes in the sensor output. This specification addresses that problem and describes an arrangement of apparatus that solves the problem for single mode optical fiber photoelastic sensors through the use of optical common mode rejection.

OBJECTS OF THE INVENTION

The principal object of the invention is to provide an improved sensing device of the photoelastic type that is insensitive to changes in ambient conditions that diminish the accuracy or sensitivity of such unimproved devices.

Another object of the invention is to provide an improved sensing device of the photoelastic type in which optical common mode rejection is obtained with single mode optical fibers.

SUMMARY OF THE INVENTION

The invention resides in a stress sensing and measuring device employing two equal but separate lengths of identical single mode optical fibers. The two single mode optical fibers are connected in series by an interposed polarization rotator which alters the polarization of the light transmitted from the output of the first optical fiber to the input of the second optical fiber. One of those single mode optical fibers is subject to stress produced by the phenomenon to be measured. Both single mode optical fibers are subject to the same ambient conditions and thus to the same stresses caused by those conditions. Polarized light is directed along the serially disposed optical fibers. Because of the photoelastic effect, the light emerging from the end of the second optical fiber has undergone a phase change proportional to the stress produced on one of the optical fibers by the phenomenon to be measured while the stresses produced on both optical fibers by ambient conditions resulted in phase changes that cancelled out due to the reversal in the direction of phase change caused by the polarization rotator. That emergent light is separated into x and y components and the light intensities of those separated components are detected by photodetectors which provide electrical output signals to a processing unit. Preferably, the processing unit divides the difference between the two signals by their sum to provide a measurement signal that is independent of fluctuations in the light source.

THE DRAWINGS

FIG. 1 diagrammatically depicts the scheme of the invention.

DETAILED DESCRIPTION OF THE PREFERRED EMBODIMENTS OF THE INVENTION

Figure 1:
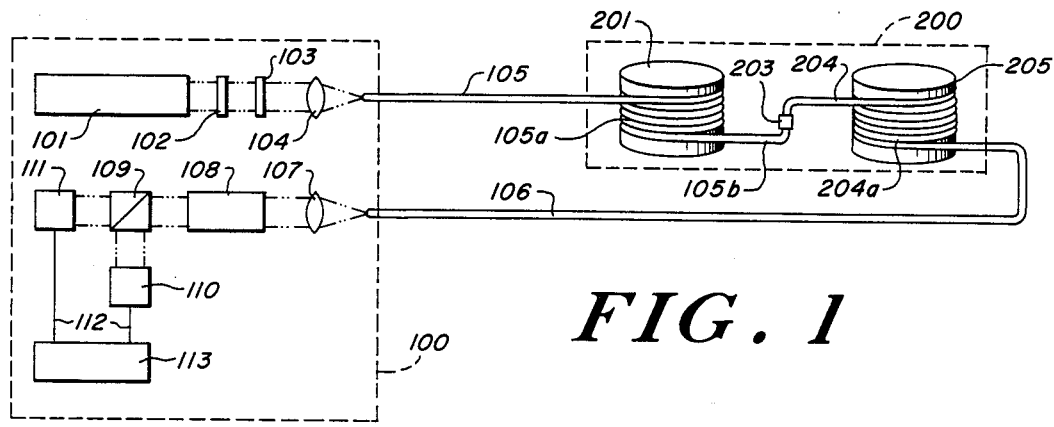

The scheme of the invention is shown in FIG. 1. An electro-optical conversion module 100 delivers optical power to a photoelastic sensing module 200 via single mode optical fiber 105 and converts the optical signals, returned via single mode optical fiber 106, to electrical signals. The electro-optical module 100 contains a source of light 101, such as a light emitting diode or a laser diode. The light from source 101 includes a range of wave lengths that is preferably centered about one predetermined wave length. Where feasible, the light may be substantially or entirely of that one predetermined wave length. The light from source 101 is directed to a polarizer 102 and then to an optical quarter wave plate 103 and emerges from that plate as circularly polarized light. The polarized light is focused by lens 104 onto the input end of fiber 105. The light entering optical fiber 105 propagates along that fiber until it reaches the sensing module 200. In that module, the polarized light passes through a length L of single mode optical fiber segment 105a. That length L of optical fiber is associated with a member 201 in such a way that stress is applied by that member to the segment 105a transversely to the direction of light propagation. For purposes of illustration, FIG. 1 shows the length L wound on an expansible drum 201 so that the single mode optical fiber segment 105a is stressed upon expansion of the drum. Where that arrangement is used, it may be provident to pre-stress the optic fiber segment so that the fiber segment is always under some stress even when the drum has contracted to its maximum extent.

The light reaching the output end of optical fiber 105 then passes through a polarization rotator 203.

The stressed length of optical fiber segment 105a has two photoelastic axes, the first axis being perpendicular to the direction of light propagation and to the direction of the applied stress and the second axis being perpendicular to the direction of light propagation and parallel to the direction of applied stress. On passing through the length L of that fiber segment, a phase difference is introduced between the components of the light in the fiber segment which are polarized along the two orthogonal axes. That phase difference may be expressed as $\pi LS/f$ where L is the length of the stressed fiber, S is the differential stress in the fiber along length L, and f is the photoelastic constant of the fiber material.

The differential stress S equals $S_1$ minus $S_2$, i.e. $S = S_1 - S_2$.

The light passing through fiber segment 105a then passes through a segment 105b of fiber 105 that is attached to the polarization rotator 203. The light emerging from the polarization rotator is transmitted along a second single mode optical fiber 204 having a segment 204a of length L mounted on a member 205 in such a way that stress is applied to the segment 204a transversely to the direction of light propagation when strain occurs in element 205. Two photoelastic axes are defined in segment 204a in the same way as for preceding segment 105a. For ease of identification the axis in segment 204a that is perpendicular to the direction of propagation and the stress direction is designated axis 1' and the axis perpendicular to the propagation direction and parallel to the stress direction is designated axis 2'.

When strain occurs in element 205, a phase difference is introduced between components of the light in the fiber polarized along orthogonal axes 1' and 2'. That phase difference may be mathematically expressed as $\pi Ls/f$, where L is the length of the stressed fiber, s is the differential stress seen in the fiber along length L, and f is the photoelastic constant of the fiber material.

The differential stress s equals $s_{1'}$ minus $s_{2'}$, i.e. $S = S_{1'} - S_{2'}$.

Polarization rotator 203 is arranged to rotate the emergent light that is polarized parallel to axis 1 of fiber segment 105a and inject that rotated light into optical fiber 204 with this polarization parallel to axis 2'. Similarly, the light polarized parallel to axis 2 in fiber segment 105a is injected into fiber segment 204a polarized parallel to axis 1'. Without the polarization rotator, the total phase difference produced in passing through the photoelastic sensing element 200 would be $\pi L(s+S)/f$. With the polarization rotator disposed between the two stressed optical fibers, that phase difference becomes $\pi L(s-S)/f$, i.e. the sensing is carried out in a differential mode. Stresses on the fibers 105a and 204a that are common to both fibers are then seen to cancel, resulting in optical common mode rejection.

The light passing through photoelastic sensing element 200 is returned to the electro-optical module 100 through the fiber 106 where that light is collimated by a lens 107, passed through a Soleil-Babinet compensator 108 to provide optical bias, and through a birefringent prism 109 which separates out the polarization components that correspond to $+\pi/4$ and $-\pi/4$ to the stress direction 2' of the fiber 204a.

The optical powers (i.e. light intensities) of those components will vary according to differential stress according to $I_1 = A \sin^2[\pi L(s-S)/f + \pi/4]$ and $I_2 = A \sin^2[\pi L(s-S)/f - \pi/4]$ where A is a constant equal to the optical power coupled into optical fiber 105 by light source 101.

The separated polarization components are detected in module 100 by photodetectors 110 and 111. The outputs of those photodetectors are then fed to a processing unit 113. That processing unit divides the difference between the two photodetector signals by their sum to obtain a voltage output that is independent of fluctuation in the optical output of the source 101. In the small stress limit, the voltage output from the processing unit will be $V = V_0[\pi L(s-S)/f]$ where $V_0$ is an adjustable constant of the processing unit 113.

POLARIZATION ROTATOR CONSTRUCTION

Figure 2:
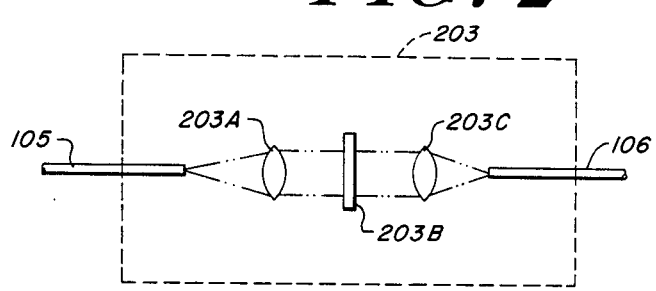
FIG. 2 depicts an embodiment of the invention for sensing and measuring pressure differentials.

The polarization rotator 203 can be constructed in a number of different ways. One such construction is depicted in FIG. 2. In that construction, the light emerging from fiber segment 105B is collimated by a lense 203A, passed through a half-wave plate 203B, and coupled into fiber segment 204a by a second lens 203C. An optical half-wave plate has the well-known property of rotating light polarized at an angle $\theta$ to its fast axis by an amount $2\theta$. Consequently, two orthogonal components of polarized light passing through an optical half-wave plate remain orthogonal after rotation by the plate. Any required amount of rotation can be obtained by appropriate orientation of the plate. Another way of constructing the polarization rotator is to twist the fiber to obtain the desired amount of rotation. Yet another polarization rotation construction is to place a segment of the fiber under a constant stress which provides the desired amount of rotation.

ACOUSTIC SENSOR EMBODIMENT

Figure 3:
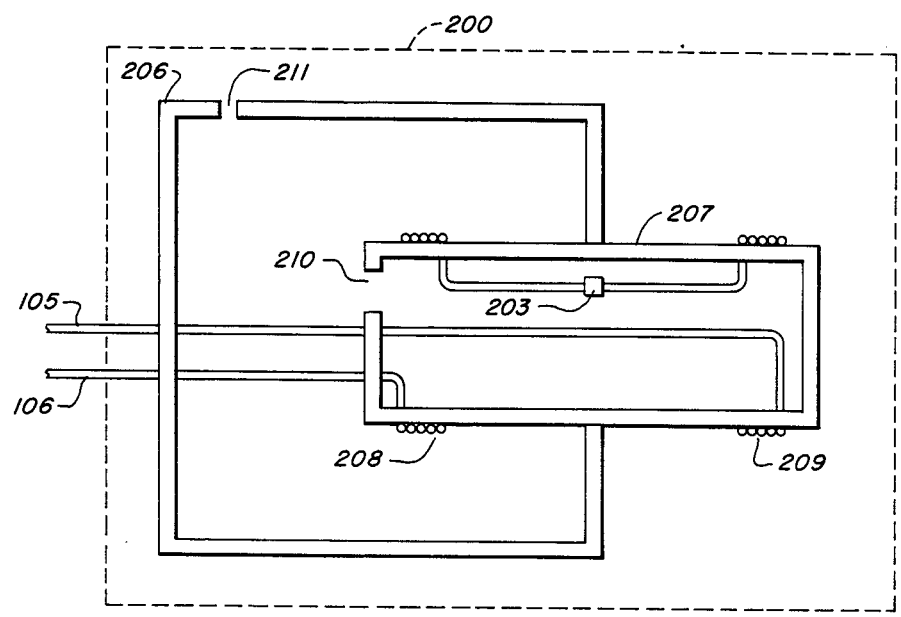
FIG. 3 depicts an embodiment of the invention for sensing and measuring differences in fluid flow rates.

To sense acoustic fields, the polarimetric stress sensing device can be configured as shown in FIG. 3. In this embodiment, two windings of equal length L are disposed about an acoustically compliant mandrel 207. The windings are made by coiling the single mode optical fiber around the mandrel. The winding 209 is exposed to the acoustic field while the other winding, 208, is isolated from the field by a housing 206. Because of that arrangement, the acoustic field stresses the winding 209 without affecting winding 208. Consequently, a differential stress due to the acoustic field is produced between the two windings. To enable equalization of static pressures between the interior and exterior of the housing, that housing is provided with a pressure relief hole 211. Similarly, to enable equalization of static pressures in the interior of housing 206 and in the interior of mandrel 207, the mandrel is provided with a pressure relief hole 210. The pressure relief holes make the device insensitive to fluctuations in static pressure. It can be appreciated that vibration, forces of acceleration, and changes in temperature that affect both windings equally give rise to "common mode" stresses whose effects cancel out, leaving a pure acoustic sensor whose output is proportional to the acoustic field acting on fiber winding 209.

PRESSURE SENSOR EMBODIMENT

Figure 4:
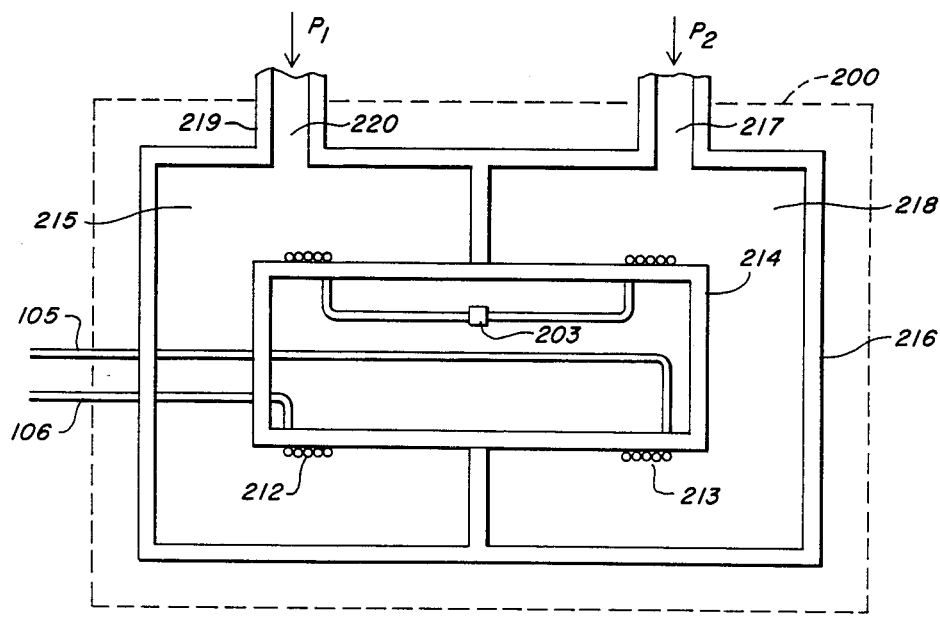
FIG. 4 depicts an embodiment of the invention for sensing and measuring magnetic forces.

To sense static pressure, the invention can be embodied as depicted in FIG. 4. In this embodiment, the differential stress is measured between two single mode optical fiber windings 212 and 213 of equal length disposed on a compliant mandrel 214. The winding 212 is exposed to pressure $P_1$ in chamber 215 of the housing 216. That housing has a second chamber 218 in which winding 213 is exposed to the pressure $P_2$ in that chamber. Conduits 219 and 217 allow the chambers to be pressurized from external sources. The difference in pressure between $P_1$ and $P_2$ produces a differential strain on the compliant mandrel 214 thereby creating differential stress on the two fiber windings, causing the output signal of the sensor to be proportional to the differential pressure. As in the FIG. 3 embodiment, the "common mode" effects of vibration, acceleration, and temperature, cancel out, leaving a pure differential pressure sensor. To modify the device to enable it to function as an absolute pressure sensor, one of the two chambers of housing 216 is evacuated and sealed.

The FIG. 4 embodiment can be employed as a flow rate sensor by connecting the conduits 217 and 219 to a pipeline in which fluid is flowing. By connecting the conduit 217 to a section of the pipeline having a different cross-sectional area then the cross-sectional area of the section to which conduit 219 is connected, then from Bernoulli's theorem, the difference in pressure at the two cross-sectional areas is proportional to the fluid flow rate squared. Consequently, the square root of the sensor output will be proportional to the flow rate.

ACCELEROMETER EMBODIMENT

Figure 5:
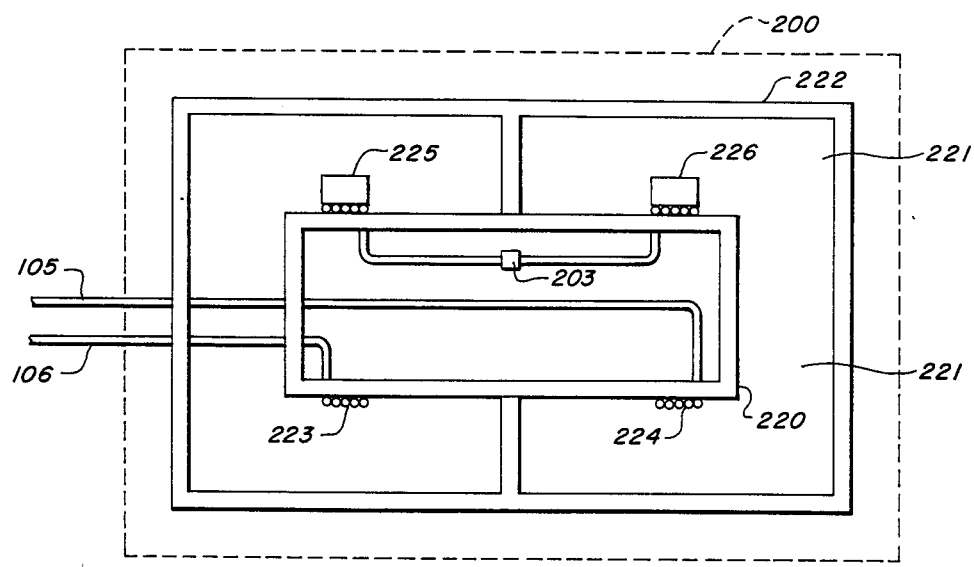
FIG. 5 depicts an embodiment of the invention for measuring temperature.

Depicted in FIG. 5 is an embodiment of the invention for sensing acceleration. In that embodiment, a mandrel 220 is supported in a chamber 221 in a housing 222. Disposed on the mandrel are 2 single mode optical fiber windings 223 and 224 of equal length. Attached to winding 223 is a mass 225 of material. Attached to the winding 224 is a body 226 of the same material whose mass is different from that of the mass of body 225. The bodies 225 and 226 are so proportioned that their contact area with the windings 225 and 226 is the same for both bodies. Because of the difference in mass, in the presence of acceleration, a differential stress is produced on the windings and results in a sensor output that is proportional to acceleration. Because of its optical common mode rejection, the FIG. 5 embodiment is insensitive to changes in temperature, changes in pressure, and other conditions which affect both windings equally.

MAGNETOMETER EMBODIMENT

The stress sensing arrangement depicted in FIG. 1 can be embodied to sense magnetic field gradients. When so embodied the mandrels 201 and 205 are made of the same magnetostrictive material. A difference in the magnetic field strengths at and the mandrels results in differential stress on the two windings 105a and 204a. That differential stress causes the sensors output signal to be proportional to the gradient of the magnetic field between the two mandrels. Because of optical common mode rejection, the magnetometer embodiment is insensitive to temperature, vibration and acceleration that effect both windings equally.

Where it is desired to measure the magnitude of the magnetic field rather than its gradient, one of the mandrels is made of magnetostrictive material while the other mandrel, of identical shape, is made of a non-magnetostrictive material whose coefficient of thermal expansion is the same as that of the magnetostrictive material. In the presence of a magnetic field, a stress is produced on the winding attached to the magnetostrictive mandrel whereas no stress is produced on the other winding. Consequently, the output signal of the sensor is proportional to the magnitude of the magnetic field which produces the stress on the stressed winding. Because the coefficients of thermal expansion of the two mandrels are matched, this embodiment is insensitive to changes in temperatue as well as to vibration and acceleration effects.

ELECTRIC FIELD SENSOR EMBODIMENT

The stress sensing device depicted in FIG. 1 can be embodied to sense electric fields in a manner analogous to that of the magnetometer embodiments. To sense the gradient of an electric field, the mandrels 201 and 205 are made electrostrictive material rather than magnetostrictive material. To sense the magnitude of an electric field, one of the mandrels is made of a non-electrostrictive material whose other properties are closely matched to those of the electrostrictive mandrel.

In all the illustrated embodiments, the photoelastic sensing module is designated by the numeral 200 and the polarization rotator which is disposed between the two windings, is designated by the numeral 203. In all the embodiments, the two windings are preferably made of the same single mode optical fibre and are of the same length so that their properties are matched.

From the foregoing exposition, those skilled in the polarametric stress sensing art will recognize that the invention can be embodied in forms different from those described in the foregoing exposition. Therefore, it is intended that this invention not be limited only to the embodiments shown or described in this specification. Rather, it is intended that the scope of this invention be construed in accordance with the appended claims.

I claim:

1. In a polarimetric device of the kind having
   (i) a first optical fiber of the kind exhibiting birefringence when stressed,
   (ii) first stress applying means responsive to phenomenon to be sensed for stressing the first optical fiber,
   (iii) a source of polarized light,
   (iv) means for directing the polarized light into the first optical fiber along its longitudinal axis, (v) beam splitting means for splitting the light transmitted through the first optical fiber into a plurality of beams, and (vi) means responsive to the plurality of beams for providing a measure of the stress on the optical fiber, the improvement providing optical common mode rejection comprising (a) a second optical fiber having substantially the same properties as the first optical fiber, the two optical fibers being in series in relation to the longitudinal transmission of the polarized light through those fibers, (b) second stress applying means for applying stress to the second optical fiber, the length subject to stress of the second optical fiber being the same as the length subject to stress of the first optical fiber, (c) an optical fiber segment interposed between and connecting the first and second optical fibers, the optical fiber segment causing polarized light transmitted through the fiber segment to be rotated by 90° whereby stresses imposed equally on the first and second optical fibers have equal and opposite effects on the phase difference between orthogonal components of the polarized light transmitted through the first and second optical fibers.

2. The improvement according to claim 1, wherein the first and second stress applying means are bodies of different mass, each of those bodies being arranged to apply stress to its corresponding optical fiber over an area of the optical fiber, and the areas stressed by both bodies being of equal size.

3. The improvement according to claims 1, wherein the first and second optical fibers and the interposed fiber segment are one continuous optical fiber.

4. The improvement according to claim 3, further including means for applying stress to the interposed fiber segment for causing the polarized light leaving the fiber segment to be at 90° relative to its polarization when entering the fiber segment.

5. The improvement according to claim 3, wherein the interposed fiber segment has a twist that causes polarized light leaving the fiber segment to be at 90° relative to its polarization when entering the fiber segment.

* * * * *